Nov. 9, 1954 O. J. LEINS 2,694,098

THERMOELECTRIC GENERATOR AND METHOD FOR PRODUCTION OF SAME

Filed May 23, 1950 2 Sheets-Sheet 1

INVENTOR.
Oscar J. Leins,
BY
Brown, Jackson, Boettcher & Dienner
Attys.

THERMOELECTRIC GENERATOR AND METHOD FOR PRODUCTION OF SAME

Filed May 23, 1950 2 Sheets-Sheet 2

INVENTOR.
Oscar J. Leins,
BY
Brown, Jackson, Boettcher & Dienner
Attys

United States Patent Office 2,694,098

Patented Nov. 9, 1954

2,694,098

THERMOELECTRIC GENERATOR AND METHOD FOR PRODUCTION OF SAME

Oscar J. Leins, Milwaukee, Wis., assignor to Milwaukee Gas Specialty Company, Milwaukee, Wis., a corporation of Wisconsin Application May 23, 1950, Serial No. 163,708

11 Claims. (Cl. 136—4)

This invention relates, in general, to a thermoelectric generator, and has particular relation to a thermoelectric generator in the form of a thermopile comprising a plurality of thermocouples connected in series, and to a method for the production of such a thermoelectric generator.

In prior practice, it has been customary to form and join the dissimilar elements of thermoelectric generators individually to form the thermoelectric junctions. Such prior practice is not as rapid and economical as may be desired. This is particularly so where the thermoelectric generator is in the form of a thermopile having a multiplicity of dissimilar thermoelectric generator elements and a multiplicity of junctions between such elements.

Prior thermoelectric generators in the form of thermopiles have also been confronted with limitations in the number of thermoelectric generator elements and thermoelectric junctions that could be practicably provided, and they have been confronted with limitations in the manner and positions in which they could be used.

One of the main objects of the present invention is to provide an improved thermoelectric generator, and, more particularly, an improved thermoelectric generator in the form of a thermopile which can be produced more rapidly and economically.

Another object of the invention is to provide an improved thermoelectric generator, and, more particularly, an improved thermoelectric generator in the form of a thermopile having a multiplicity of dissimilar thermoelectric generator elements and a multiplicity of junctions between such elements, and which will not be confronted with limitations in the number of thermoelectric generator elements and thermoelectric junctions that may be practicably provided, or with limitations in the manner or positions in which the thermoelectric generator may be used.

Another object of the invention is to provide an improved form of thermoelectric generator in which the dissimilar thermoelectric generator elements are deposited upon a surface by printing, evaporating, plating, painting, spraying, chemical deposition, vacuum processes, dusting, or in any other equivalent manner. Thermoelectric generators produced by any of these methods will be referred to herein under the general classification of printed thermoelectric generators.

Another object of the invention is to provide in a thermoelectric generator of the class described an improved support, and, more particularly, an improved supporting sheet for the thermoelectric generator deposited or printed thereon, which supporting sheet will afford a wide degree of flexibility in the process of applying the thermoelectric generator and in the utility of the finished device because it can, for example, be folded, and may allow for different expansion and contraction of the dissimilar elements of the thermoelectric generator.

Another object of the invention is to provide an improved arrangement of the thermoelectric generator elements and thermoelectric junctions on the sheet or other support which will permit use of the thermoelectric generator in a wide variety of ways, for a wide variety of purposes, and in a wide variety of positions.

Another object of the invention is to provide an improved method of making thermoelectric generators according to the present invention.

Other objects and advantages, and numerous adaptations of the invention will be apparent from the following detailed description and the accompanying drawings.

Figure 1:
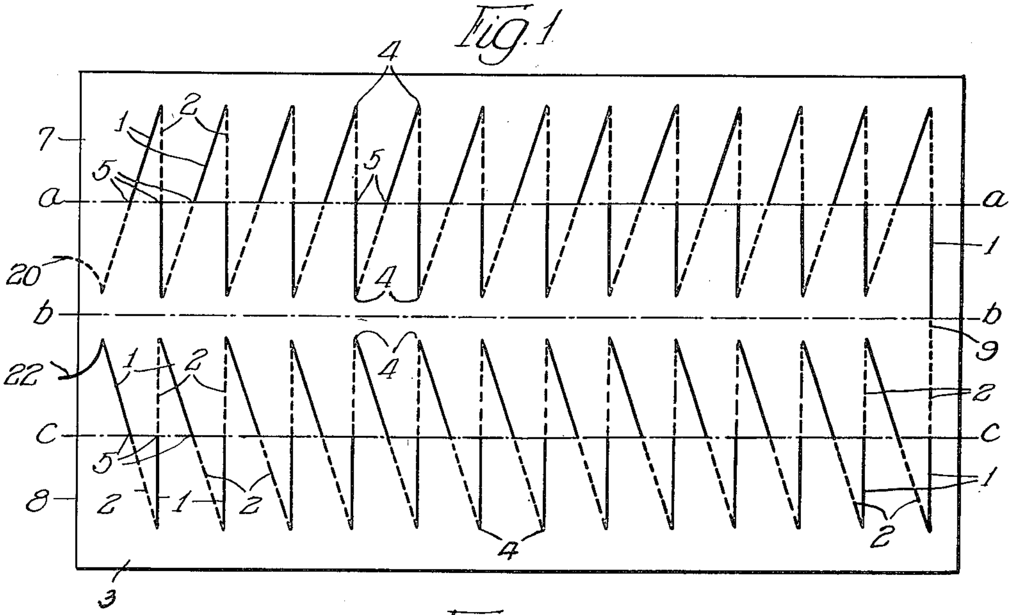
Figure 1 is a plan view of one form of thermoelectric generator embodying the present invention showing the same in flat form and before folding as will hereinafter appear.
Figure 2:
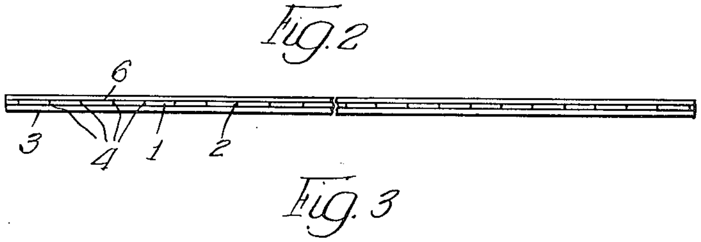
Figure 2 is an edge view of the thermoelectric generator as shown in Figure 1.
Figure 3:
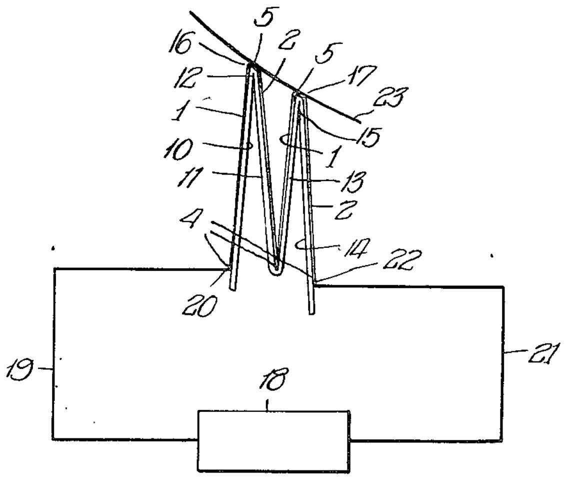
Figure 3 is an end view of the thermoelectric generator shown in Figures 1 and 2 after folding the same, and showing one manner of using the thermoelectric generator and one illustrative circuit therefor.

Referring first to Figures 1–3 of the drawings, the embodiment of the invention therein illustrated shows more or less schematically one form of thermoelectric generator in the form of a thermopile embodying the present invention; also one illustrative method of producing such thermopile and one illustrative manner in which it may be used.

According to this embodiment of the invention, the first step is to deposit thermoelectric generator elements 1 and 2 on a sheet 3 of thermoelectric insulating material which is preferably flat and flexible. The thermoelectric generator elements 1 and 2 have contiguous ends which are joined together, for example, in the deposition of the elements on the sheet 3, or otherwise as desired, to form thermoelectric junctions 4 which constitute the cold junctions of the thermoelectric generator, and thermoelectric junctions 5 which constitute the hot junctions of the thermoelectric generator.

The members 1 and 2 may be formed of any suitable or preferred dissimilar thermoelectric materials. The members 1 may, for example, be formed of stainless steel, copel, constantan, Chromel, or any other metal in the thermoelectric series well known in the art, and the members 2 may be formed of the opposite or dissimilar metal separated in the thermoelectric series from the metal from which the members 1 are formed.

While dissimilar metals in the thermoelectric series are referred to, it is to be understood that the present invention is not, in its broader aspects, limited to use of thermoelectric generator elements made of dissimilar metals. The members 1 and 2 may be formed from dissimilar thermoelectric alloys, or from any other dissimilar thermoelectric materials which, when joined together and heated at the hot junctions, will produce a thermoelectric current. The appended claims are to be construed accordingly.

The sheet 3 may be formed of paper or cloth, for example, asbestos paper or asbestos cloth; or it may be formed of mica, synthetic mica, ceramic material, filled cloth, or any other suitable sheet material. The sheet 3, which is made of thermoelectric insulating material, is preferably flexible to afford a wide range of flexibility in the process of applying the thermoelectric generator elements 1 and 2 to the sheet. Flexibility of the sheet also permits folding of the sheet 3 as will presently appear, or otherwise as desired within the scope of the present invention, to bring the thermoelectric generator elements into compact and advantageous relation. The sheet 3 is also preferably of refractory character, at least to the extent to withstand the heat to which the hot junctions of the thermoelectric generator are subjected in use.

The sheet 3 may also have some degree of extensibility, or it may be otherwise of a character to allow for any different expansion and contraction of the thermoelectric generator elements. Asbestos paper and asbestos cloth.

for example, are admirably suited for accomplishing these results, but it is to be understood that any of the other materials previously set forth, or any other equivalent or desired materials, may be used within the scope of the broader aspects of the present invention.

The thermoelectric generator elements 1 and 2 may be deposited upon or applied to the surface of the sheet 3 by printing, evaporating, plating, painting, spraying, chemicals deposition, vacuum processes, dusting, or in any other equivalent or suitable manner. Deposition or application of conducting metals to the surface of a support by any of these methods, or by equivalent methods, are known under the general classification of printing processes. Such processes are known in the art, and therefore will not be described in detail in the present application.

In depositing the thermoelectric generator upon, or applying it to the sheet 3, the elements 1 and 2 may be applied simultaneously, and their contiguous ends may be joined to form the thermojunctions 4 and 5 simultaneously with the deposition or application of the thermoelectric generator elements 1 and 2 to the sheet. Alternatively, if desired, one set of elements—for example, the elements 1—may be deposited upon or applied to the sheet 3 first, and then the other set of elements 2 may be deposited upon or applied to the sheet 3 with their ends joined to the ends of elements 1 to form the thermojunctions 4 and 5. Other equivalent manners of applying and joining the elements are contemplated within the scope of the present invention.

While in its broader aspects this invention contemplates use of the thermoelectric generator without a coating over the outer surfaces of the thermoelectric generator elements 1 and 2, where such a coating is desired it may be applied as shown at 6 in Figure 2 after deposition or application of the elements 1 and 2 to the sheet 3, and, for example, while the sheet is in flat form. The coating 6 is a thermoelectric insulating coating covering the outer sides of the thermoelectric generator elements 1 and 2. It may be applied, for example, by spraying, painting, dipping, or in any other suitable manner.

The coating 6 may be of any suitable thermoelectric insulating material; for example, a vinyl resin material such as polyvinyl formal produced by the reaction of polyvinyl acetate with formaldehyde. Such a material is available from Shawinigan Products Corporation, 350 Fifth Avenue, New York, N. Y., under the trade-mark "Formvar." This lacquer or coating is a good thermoelectric insulator, and it has flexibility, extensibility, resistance to abrasion and mechanical use and other toughness characteristics. Moreover, it is heat resistant to the extent that it will withstand the heat to which the hot junctions of the thermoelectric generator are subjected. "Formvar" coated wire is available under the trade-mark "Formex." Other suitable thermoelectric insulating coatings are contemplated within the scope of the present invention.

In Figure 1 there are, in effect, two thermopiles 7 and 8 in parallel relation and each comprising a plurality of thermocouples connected in series. The element 1 at one end of the thermopile 7 is joined at 9 to the opposite element 2 at the adjacent end of the thermopile 8. The junction at 9 may be deposited or applied to the sheet 3 in the deposition or application of the elements 1 and 2 to the sheet, or otherwise as desired, thereby providing a multiplicity of thermocouples connected in series in adjacent rows. Obviously parallel connections may be made where desired, or series parallel connections or other known combinations may be employed.

The next step according to this embodiment of the invention is to fold the sheet 3 along dot and dash lines *a—a*, *b—b*, and *c—c* (Figure 1) to the folded relation shown in Figure 3. Instead of two rows of thermocouples as shown in Figure 2, there may, within the scope of the present invention, be only one row folded along the junctions which are to serve as the hot thermojunctions, or there may be two or more rows of thermocouples connected in series. Where there is only one row, or more than two rows, the number of folds will, of course, vary. By increasing the number of rows of thermocouples connected in series, a very great or any desired number of connected thermocouples and thermoelectric junctions may be provided in a very compact thermopile adapted for advantageous use in a wide range of manners and positions.

When the sheet is folded, for example, as shown in Figure 3, the thermoelectric generator elements 1 and 2 are disposed or extend along opposite sides 10 and 11 of the fold 12, and along opposite sides 13 and 14 of the fold 15 (Figure 3). The elements 1 and 2 converge to and are joined at the peaks 16 and 17 of the folds 12 and 15, thus disposing the hot thermojunction 5 along the peaks 16 and 17 of the respective folds.

If desired, for a purpose which will presently appear, the peak 17 of the fold 15 may be offset from the peak 16 of the fold 12 as shown in Figure 3. This offsets the thermoelectric junctions along the peak 17 of the fold 15 from the thermoelectric junctions 5 along the peak 16 of the fold 12.

Upon completion of the thermopile, it may be used wherever it is desired to produce a thermoelectric current when, for example, the thermojunctions 5 are heated or brought to a predetermined temperature.

In Figure 3 the device indicated diagrammatically at 18 may be a thermoelectric shut-off valve having an electromagnet provided with a coil which, when energized, holds a safety shut-off valve in open position as shown and described in Oscar J. Leins Patent No. 2,126,564, patented August 9, 1938; or the device 18 may be a thermoelectric switch of the type shown and described in Clarence Wantz Patent No. 2,190,303, patented February 13, 1940; or a bleed control for a diaphragm valve of the type shown and described in Wunsch and Schuppert Patent No. 2,291,567, patented July 28, 1942; or a control device of the type shown and described in Lourdes V. McCarty Patent No. 2,349,443, patented May 23, 1944; or the bucking coil of a control device of the type shown and described in Thornbery and Wetzel Patent No. 2,340,234, patented January 25, 1944; or any other suitable device for energization by the thermoelectric generator.

One side of the device 18 is connected by a conductor 19 to one of the cold terminals 20 of the thermopile, and the other side of the device 18 is connected by a conductor 21 to the other cold terminal 22 of the thermopile.

Where the device 18 is a bucking relay or coil, it may be used, for example, as a limit control for closing a valve or opening a switch when the temperature to which the hot junctions 5 are subjected rises to the limit at which, for example, the flow of fuel to a burner is to be shut off.

Where, for example, the device is used as a limit control, it may be applied as shown in Figure 3 to a hot surface 23. This surface 23 is illustrative of a part or substance wherein, when heated to a predetermined temperature, it is desired to shut off, for example, the flow of fuel to a main burner. In this respect it will be noted that the offsetting of the peaks 16 and 17 of the folds 12 and 15 conforms the peaks of the folds and the thermoelectric junctions 5 therealong to the curved or other non-planar contour of the hot surface 23.

Figure 4:
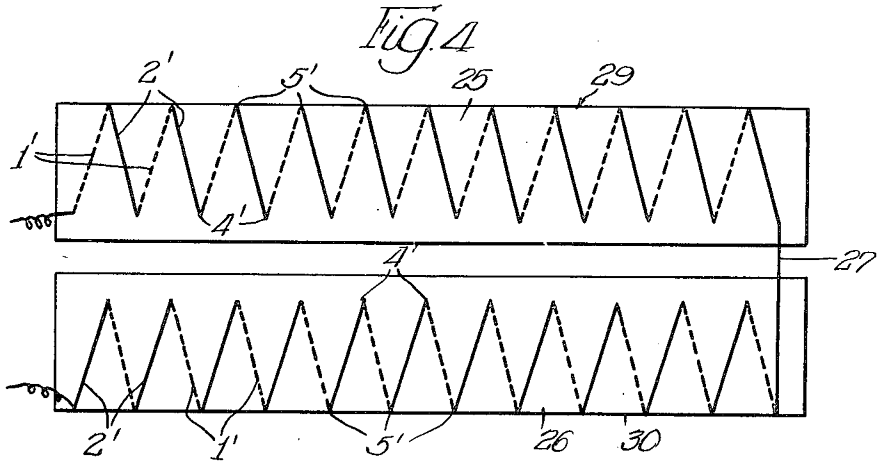
Figure 4 is a plan view of another form of thermoelectric generator embodying the present invention, with the supports for the thermoelectric generator disposed in coplanar relation.
Figure 5:
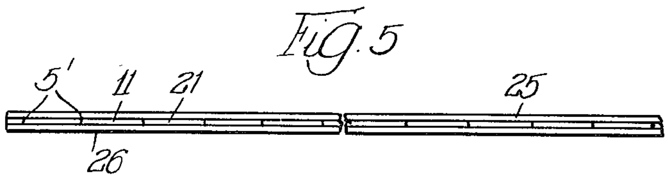
Figure 5 is an edge view showing one support and the adjacent portion of the thermoelectric generator of Figure 4.
Figure 6:
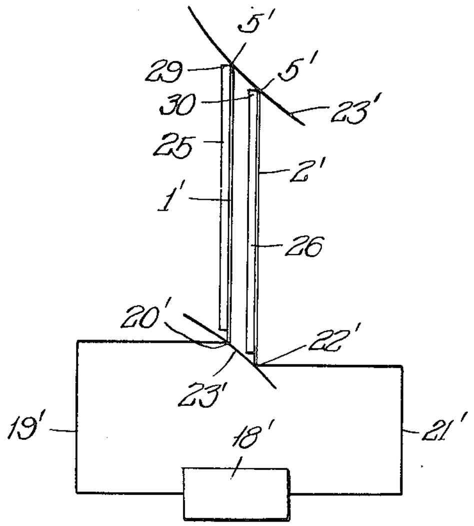
Figure 6 is an end view of the thermoelectric generator shown in Figures 4 and 5, showing one manner of using the thermoelectric generator and one illustrative circuit therefor.

In the embodiment of the invention illustrated in Figures 4–6, there are two individual supporting plates 25 and 26 which are formed of thermoelectric insulating material and may be relatively rigid or flexibile, as desired.

One plate 25 has deposited on or applied thereto, for example, in any of the ways previously set forth, a thermopile comprising a plurality of alternately dissimilar thermoelectric generator elements 1′ and 2′ joined at the hot junctions 5′ and at the cold junctions 4′. The other plate 26 has, for example, similarly deposited on or applied thereto a thermopile comprising a plurality of alternately dissimilar thermoelectric generator elements 1′ and 2′ joined at the hot junctions 5′ and at the cold junctions 4′. The element at one end of one thermopile is connected at 27, as in the preceding embodiment of the invention, to the elements at the adjacent end of the other thermopile, thus connecting the thermopiles in series. There may be additional plates bearing similar thermopiles and similarly connected in series or in parallel with the thermopiles shown and described.

If desired, the outer surfaces of the thermoelectric generators of Figures 4–6 may be coated with a suitable thermoelectric insulating coating as described in connection with the preceding embodiment of the invention. Such a coating is shown at 28 in Figure 5.

Upon completion of the thermoelectric generator on the respective plates, the plates are arranged in substantially close parallel relation as shown in Figure 6. The hot junctions 5′ are preferably positioned along or in juxtaposition to the adjacent edges 29 and 30 of the respective plates 25 and 26, and the plates may be assembled with the edge 30 of the plate 26 and the hot junctions 5′ therealong offset from the edge 29 of the plate 25, and the hot junctions 5′ along said edge 29.

The embodiment of the invention shown in Figures 4–6 may be used in any of the ways described in connection with the preceding embodiment of the invention, or in any other suitable or preferred manner. Where, for example, this device is used as a limit control, it may be applied as shown in Figure 6 to a hot surface 23′. This surface is similar to the surface 23 shown in the preceding embodiment of the invention. It will be noted that the offsetting of the edges 29 and 30 of the plates 25 and 26 conforms these edges of the plates and the hot junctions 5′ therealong to the curved or other non-planar contour of the hot surfaces 23.

If desired, the cold junctions may be disposed in juxtaposition to the edges of plates 25 and 26 opposite the edges in juxtaposition to which the hot junctions 5′ are disposed, and, in use, the cold junction ends may contact a cold surface 23″ as shown in Figure 6. The thermoelectric generator of Figures 1–3 may be constructed and used in the same manner. In this way the temperature at the hot junctions 5′ may perform a control function, assuming that the temperature of the cold junctions is constant, or the cold junctions may perform a control function, assuming that the temperature of the hot junctions is constant, or a combined function may be obtained.

In Figure 6 the device 18′ and conductors 19′ and 21′ connecting it at 20′ and 22′ to the cold terminals of the thermoelectric generator may be similar to those described in connection with Figure 3, or of other suitable form.

The embodiments of the invention shown in the drawings are for illustrative purposes only, and it is to be expressly understood that said drawings and the accompanying specification are not to be construed as a definition of the limits or scope of the invention, reference being had to the appended claims for that purpose.

I claim:

1. A thermoelectric generator comprising a folded sheet of thermoelectric insulating material, and a plurality of thermoelectric generator elements formed alternately of dissimilar thermoelectric materials and deposited on said sheet in position extending across the fold and along opposite sides thereof, said thermoelectric generator elements having contiguous ends joined together at the peak of the fold to form thermoelectric junctions therealong.

2. A thermoelectric generator according to claim 1 wherein the sheet of thermoelectric insulating material is of a character to allow for different expansion and contraction of the dissimilar thermoelectric generator elements.

3. A thermoelectric generator comprising a sheet of thermoelectric insulating material having a plurality of folds therein, and a plurality of thermoelectric generator elements formed alternately of dissimilar thermoelectric materials and deposited on said sheet in position extending across the fold and along opposite sides thereof, said thermoelectric generator elements having contiguous ends joined together at the peak of the fold to form thermoelectric junctions therealong.

4. A thermoelectric generator according to claim 3 wherein the peaks of the folds are offset to offset the thermoelectric junctions along the peaks of the folds.

5. The method of making a thermoelectric generator which comprises depositing thermoelectric generator elements formed alternately of dissimilar thermoelectric materials on a flexible sheet of thermoelectric insulating material with contiguous ends of said elements joined together to form aligned thermoelectric junctions, and folding the sheet along the aligned thermoelectric junctions to dispose the thermoelectric junctions along the peak of the fold and the thermoelectric generator elements along opposite sides of the fold.

6. The method of making a thermoelectric generator which comprises depositing thermoelectric generator elements formed alternately of dissimilar thermoelectric materials on a flexible sheet of thermoelectric insulating material with contiguous ends of said elements joined together to form aligned thermoelectric junctions, applying a thermoelectric insulating coating over the outer sides of said thermoelectric generator elements, and folding the sheet along the aligned thermoelectric junctions to dispose the thermoelectric junctions along the peak of the fold and the thermoelectric generator elements along opposite sides of the fold.

7. In a thermoelectric generator, an electrically insulating sheet carrying on one surface thereof a ziz-zag formation comprising a series of angular legs, each leg having a pair of sections of dissimilar thermoelectric materials meeting and joined along a median line between the apices of the angular legs with the sections of dissimilar thermoelectric materials reversely arranged in successive legs to form dissimilar thermojunctions along said median line, dissimilar thermoelectric sections of adjacent legs being joined at the apices of said zig-zag formation to form a series of thermojunctions to one side of said median line and another series of thermojunctions to the other side of said median line, said sheet being folded along said median line to place the opposite side of said sheet to one side of said median line and the opposite side of said sheet to the other side of said median line back to back with said first mentioned dissimilar thermojunctions at the outer side of the fold and with the two folded sides of the insulating sheet disposed between the dissimilar thermoelectric sections.

8. In a thermoelectric generator, an electrically insulating sheet carrying on one surface thereof a plurality of zig-zag formations each comprising a series of angular legs, each leg of each such formation having a pair of sections of dissimilar thermoelectric materials meeting and joined along median lines between the apices of the angular legs with the sections of dissimilar thermoelectric materials reversely arranged in successive legs to form dissimilar thermojunctions along each of said median lines, dissimilar thermoelectric sections of adjacent legs of each said zig-zag formation being joined at the apices of said zig-zag formation to form a series of thermojunctions to one side of each median line and another series of thermojunctions to the other side of each median line, said sheet being folded along each median line to place the opposite side of said sheet to one side of each median line and the opposite side of said sheet to the other side of each median line back to back with said first mentioned dissimilar thermojunctions at the outer side of each fold and with the folded sides of the insulating sheet disposed between the dissimilar thermoelectric sections, the folds of said sheet at the edges of which dissimilar thermoelectric sections are joined being offset with respect to each other for application to a curved surface.

9. A thermoelectric generator comprising an insulating base, and a continuous zig-zag strip carried only on one side of said base and comprising successive angular legs of dissimilar thermoelectric materials, dissimilar angular legs of said strip having contrary directions and joined to form thermojunctions at one edge of said base and at the apices of said joined dissimilar angular legs.

10. A thermoelectric generator comprising an insulating base, and a continuous zig-zag strip carried only on one side of said base and comprising successive angular legs of dissimilar thermoelectric materials, dissimilar angular legs of said strip having contrary directions and joined to form thermojunctions at one edge of said base and at apices of said joined dissimilar angular legs, the other apieces of the strip being formed by joining opposite ends of said dissimilar legs to form thermojunctions spaced from the opposite edge of said base.

11. A thermoelectric generator comprising a plurality of insulating bases, and a continuous zig-zag strip carried only on one side of each base and comprising successive angular legs of dissimilar thermoelectric materials, dissimilar angular legs of said strip having contrary directions and joined to form thermojunctions at one edge of each base and at apices of said joined dissimilar angular legs, said bases being arranged generally side by side and with the edges at which said dissimilar legs are joined offset with respect to each other for application to a curved surface.

(References on following page)

References Cited in the file of this patent

UNITED STATES PATENTS

| Number | Name | Date |
| --- | --- | --- |
| 1,638,943 | Little | Aug. 16, 1927 |
| 1,643,734 | Zworykin | Sept. 27, 1927 |
| 2,441,960 | Eisler | May 25, 1948 |
| 2,519,785 | Okolicsanyi | Aug. 22, 1950 |
| 2,562,696 | Canada | July 31, 1951 |

FOREIGN PATENTS

| Number | Country | Date |
| --- | --- | --- |
| 144,757 | Great Britain | June 18, 1920 |